United States Patent [19]
Park et al.

[11] Patent Number: 6,040,219
[45] Date of Patent: Mar. 21, 2000

[54] METHOD OF FABRICATING POWER SEMICONDUCTOR DEVICE USING SEMI-INSULATING POLYCRYSTALLINE SILICON (SIPOS) FILM

[75] Inventors: Chan-ho Park, Incheon; Jae-hong Park, Bucheon, both of Rep. of Korea

[73] Assignee: Samsung Electronics Co., Ltd., Suwon, Rep. of Korea

[21] Appl. No.: 09/150,171

[22] Filed: Sep. 9, 1998

[30] Foreign Application Priority Data

Sep. 9, 1997 [KR] Rep. of Korea ..................... 97-46397

[51] Int. Cl.$^7$ ................................................ H01L 21/336
[52] U.S. Cl. ......................... 438/268; 438/282; 438/283
[58] Field of Search ..................... 438/268, 272, 438/273, 282, 283, 699

[56] References Cited

U.S. PATENT DOCUMENTS

| | | | |
|---|---|---|---|
| 4,454,526 | 6/1984 | Nishizawa | 357/30 |
| 4,733,287 | 3/1988 | Bower | 357/34 |
| 4,800,415 | 1/1989 | Simmons et al. | 357/34 |
| 4,803,176 | 2/1989 | Bower | 437/33 |
| 5,060,047 | 10/1991 | Jaume et al. . | |
| 5,410,177 | 4/1995 | Harmel et al. | 257/567 |
| 5,424,563 | 6/1995 | Temple et al. | 257/154 |
| 5,608,237 | 3/1997 | Aizawa et al. | 257/132 |
| 5,773,868 | 6/1998 | Endo | 257/514 |
| 5,923,071 | 7/1999 | Saito | 257/458 |

OTHER PUBLICATIONS

Takeshi Matsushita et al., "Highly Reliable High–Voltage Transistors by Use of the SIPOS Process", IEEE Transactions on Electron Devices, vol. ED–23, No. 8, Aug. 1976.

A. Mimura et al., "High–Voltage Planar Structure Using SiO2–SIPOS–SiO2 Film", IEEE Electron Device Letters, vol. EDL–6, No. 4, Apr. 1985.

D. Jaume et al., "High–Voltage Planar Devices Using Field Plate and Semi–Resistive Layers", IEEE Transactions on Electron Devices, vol. 38, No. 7, Jul. 1991.

*Primary Examiner*—David Nelms
*Assistant Examiner*—Michael S. Lebentritt
*Attorney, Agent, or Firm*—Jones Volentine, L.L.P.

[57] ABSTRACT

A method for manufacturing a power semiconductor device including a semi-insulating polycrystalline silicon (SIPOS) film is provided. According to this method, first, a conductive collector region is formed in a semiconductor substrate. Then, a first insulating film, which exposes a portion of the semiconductor substrate in which a base region is to be formed, is formed on said semiconductor substrate in which the collector region is formed. A conductive base region is formed in the collector region. A second insulating film is formed over the entire surface of the semiconductor substrate. After exposing a portion of the semiconductor substrate in which an emitter region and a channel stop region are to be formed, impurities for the emitter region are implanted into the base region. Simultaneously, a third insulating film is formed over the entire surface of the semiconductor substrate, while a conductive emitter region is formed by diffusing the impurities. At least one of the first to third insulating films is left only in a field region between the base region and the channel stop region. Parts of the base region, the emitter region, and the channel stop region are exposed after forming a semi-insulating polycrystalline silicon (SIPOS) film on the entire surface of the resultant structure. A base electrode, an emitter electrode, and an equipotential metal ring are then formed, respectively contacting the base region, the emitter region, and the channel stop region.

14 Claims, 4 Drawing Sheets

METHOD OF FABRICATING POWER SEMICONDUCTOR DEVICE USING SEMI-INSULATING POLYCRYSTALLINE SILICON (SIPOS) FILM

BACKGROUND OF THE INVENTION

1. Field of the Invention

The present invention relates to a method of fabricating a power semiconductor device, and more particularly, to a method of fabricating a power semiconductor device that has a high breakdown voltage using a semi-insulating polycrystalline silicon (SIPOS) film.

2. Description of the Related Art

A recent trend towards large, high-capacity applications has created a need for a power semiconductor device having a high breakdown voltage, high-speed switching, and high current capability. The power semiconductor device particularly requires a low saturation voltage to lower power loss in a conductive state when allowing a significantly large current to flow. High breakdown voltage, a fundamental requirement for power semiconductor device, means that the power semiconductor devices can resist a high reverse voltage, as may be applied when the device is switched off or at the moment of switching off.

Meanwhile, the breakdown voltage of a semiconductor device is determined by a depletion region, which is formed at a P-N junction portion, since most of the voltage applied to the P-N junction portion is applied to the depletion region. The breakdown voltage has been known to be affected by the curvature of the depletion region. In other words, at a planar junction an electric field is concentrated at a curved portion rather than a flat portion. Accordingly, an avalanche breakdown is easily generated at the edge of the junction, and the breakdown voltage of the entire depletion region is reduced.

Various techniques have been proposed to prevent the electric field from concentrating at the edge of a junction. Among them, there are included: (1) a method of forming a field plate on a substrate of a field region adjacent to the edge of the planar junction (reference document: "Power semiconductor device", 1996, B. J. Baliga, pages 100–102); (2) a method of forming a field limiting ring as an impurity layer having a conductive type opposite to the junction in the field region of the substrate; (3) and a method of forming a semi-insulating polycrystalline silicon (SIPOS) layer on a substrate on which the planar junction is formed. These methods all increase the breakdown voltage by enhancing the curvature of a depletion region.

The method using the SIPOS film is a relatively simple process, and can stabilize the characteristics of a device by removing a surface-state effect from a silicon substrate, while simultaneously increasing a breakdown voltage. As a result, this method has attracted attention recently.

FIGS. 1 and 2 are sectional views of a conventional power transistor using a SIPOS film.

Referring to FIG. 1, first conductive high concentration ($N^+$) and low concentration ($N^-$) collector regions 2 and 4 are sequentially formed to make a bottom layer. A second conductive $P^+$ base region 6 is formed in the bottom layer, and a first conductive $N^+$ emitter region 8 is formed in the base region 6. An $N^+$ channel stop region 10 for device isolation is formed in a field region separated by a predetermined interval from the base region 6.

Also, an insulating film 12 (preferably an oxide film) and a semi-insulating polycrystalline silicon (SIPOS) film 14 are sequentially formed over the semiconductor substrate. A base electrode 16, an emitter electrode 18, and an equipotential metal ring 22 are formed to contact the base region 6, the emitter region 8, and the channel stop layer 10, respectively, through contact holes. A collector electrode 20 is formed on the other surface of the high-concentration ($N^+$) collector region 2.

According to the conventional power transistor described above, the insulating film 12 and the SIPOS film 14 are deposited and then etched, and then the base electrode 16, the emitter electrode 18, and the equipotential metal ring 22 are formed. At this time, a dry or wet etching method is employed.

However, the process of dry-etching the oxide film 12 is expensive, thus degrading productivity. When wet etching is employed, voids (V) are generated under the SIPOS film 14 as shown in FIG. 2, because of the isotropic etching characteristics of the wet etching method. The voids formed between the oxide film 12 and the electrodes 18 and 22 have a bad influence on the device's reliability, due to humidity and expansion coefficient difference. In particular, processes for forming a base contact and for forming an emitter contact are usually conducted simultaneously when fabricating a transistor, so that a void at the emitter contact is enlarged due to the over-etching of the emitter contact.

SUMMARY OF THE INVENTION

An object of the present invention is to provide a method of fabricating a power semiconductor device that can improve reliability while reducing manufacturing costs.

To accomplish the above object, in a method for manufacturing a power semiconductor device, a conductive collector region is formed in a semiconductor substrate. Then, a first insulating film is formed over collector region, the first insulating film exposing a first portion of the collector region. A conductive base region is then formed in the exposed first portion of the collector region. Next, a second insulating film is formed over the collector region, the second insulating film exposing a second portion of the collector region and a third portion of the base region. First impurities for the emitter region are implanted into the third portion of the base region, and second impurities for the channel stop region are implanted into the second portion of the collector region. Then, simultaneously, a third insulating film is formed over the collector region, a conductive emitter region is formed by diffusing the first implanted impurities, and a channel stop region is formed by diffusing the second implanted impurities. Portions of the first, second, and third insulating films over the base, emitter, and channel stop regions are then removed to create a remaining insulating film in a field region between the base region and the channel stop region. A semi-insulating polycrystalline silicon (SIPOS) film is formed over the semiconductor substrate and the remaining insulating layer, such that parts of the base region, the emitter region, and the channel stop region are exposed. Finally, a base electrode is formed contacting the base region, an emitter electrode is formed contacting the emitter region, and an equipotential metal ring is formed contacting the channel stop region.

After the SIPOS film is formed, a protective film being an oxide film or a nitride film can be formed over the SIPOS film.

To accomplish the above object, in another method for manufacturing a power semiconductor device, a conductive cathode region is first formed in a semiconductor substrate. A first insulating film is then formed over the cathode region, the first insulating film exposing a first portion of the cathode region. Next, a conductive anode region is formed in the exposed first portion of the cathode region. A second insulating film is then formed over the cathode region, the second insulating film exposing a second portion of the cathode region. Then, channel stop impurities are implanted into the exposed second portion of the cathode region. Next, simultaneously a third insulating film is formed over the cathode region and a conductive channel stop region is formed by diffusing the channel stop impurities. portions of the first, second, and third insulating films over the anode and channel stop regions are removed to create a remaining insulating film in a field region between the anode region and the channel stop region. A semi-insulating polycrystalline silicon (SIPOS) film is then formed over the semiconductor substrate and the remaining insulating layer such that parts of the anode region and channel stop region are exposed. Finally an anode electrode is formed contacting the anode region, and an equipotential metal ring is formed contacting the channel stop region.

After the SIPOS film is formed, a protective film being an oxide film or a nitride film can be formed over the SIPOS film.

BRIEF DESCRIPTION OF THE DRAWINGS

The above object and advantages of the present invention will become more apparent by describing in detail a preferred embodiment thereof with reference to the attached drawings in which.

DETAILED DESCRIPTION OF THE INVENTION

Figure 1:
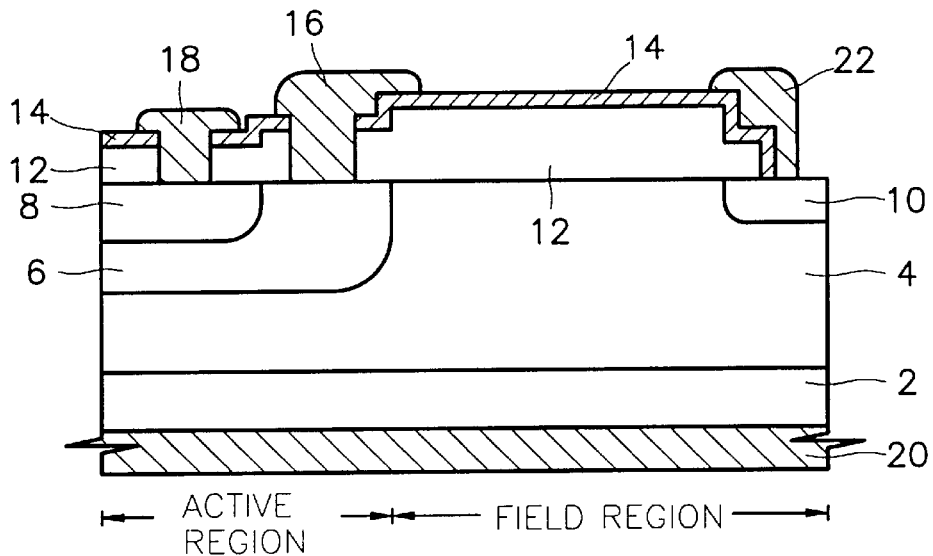
FIGS. 1 and 2 are cross-sectional views of a conventional power transistor using a SIPOS film.
Figure 2:
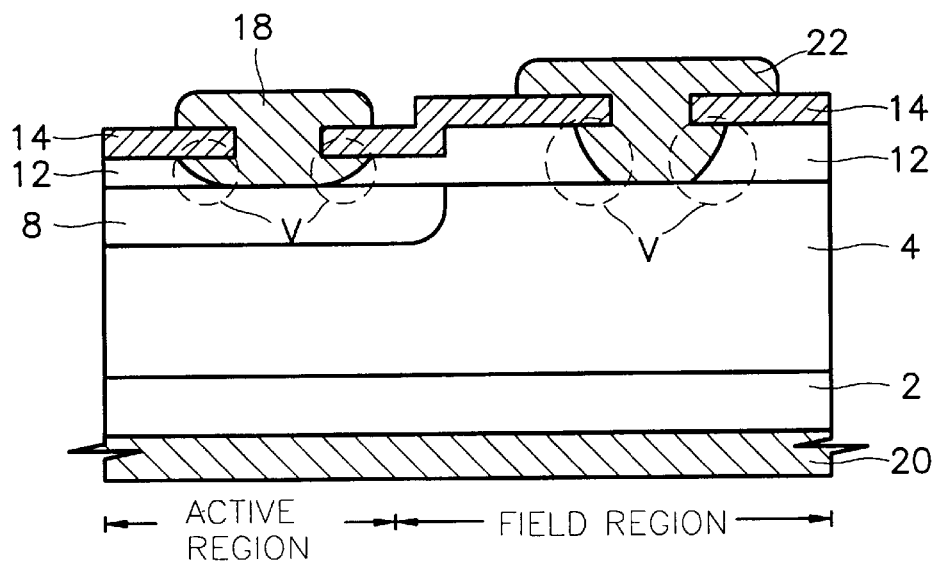

Hereinafter, embodiments of the present invention will be described in detail with reference to the attached drawings. However, the embodiments of the present invention can be modified into various other forms, and the scope of the present invention must not be interpreted as being restricted to these embodiments. The embodiments are provided to more completely explain the present invention to those skilled in the art. In drawings, the thicknesses of layers or regions are exaggerated for clarity. Like reference numerals in the drawings denote the same members. Also, when it is written that a layer is formed "on" another layer or a substrate, the layer can be formed directly on the other layer or the substrate, or other layers can intervene between the two layers.

FIGS. 3 through 7 are cross-sectional views illustrating a method of manufacturing a power semiconductor device according to a first preferred embodiment of the present invention.

Figure 3:
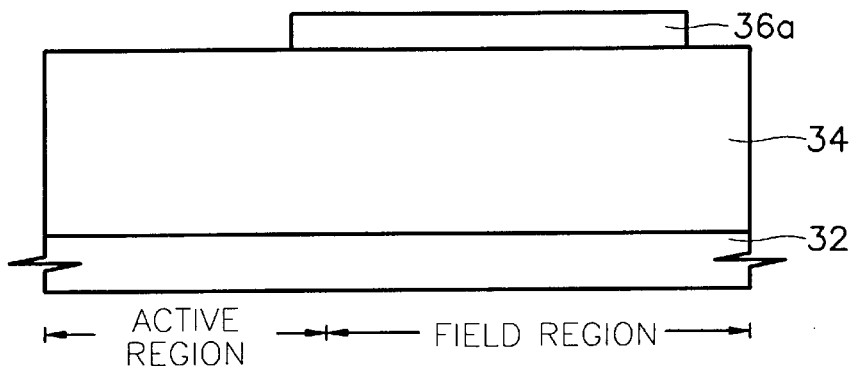
FIGS. 3 through 7 are cross-sectional views illustrating a method for fabricating a power semiconductor device according to a first preferred embodiment of the present invention.

FIG. 3 shows the step of forming a first mask 36a to form a base region. To be more specific, an insulating film, e.g., an oxide film is formed on a semiconductor substrate on which first conductive collector regions 32 and 34, which are doped with N-type impurities respectively at high and low concentrations, are formed. The oxide film is etched by a conventional photolithography process, thereby forming the first mask 36a for forming the base region.

As is well-known, the high- and low-concentration collector regions 32 and 34 can be formed by a diffusion or an epitaxial method. When the diffusion method is adopted, N-type impurities are ion-implanted at a high concentration on the other surface of the semiconductor substrate doped at low concentration with N-type impurities such as phosphorus (P). Then, the resultant structure is thermally treated to diffuse the impurity ions, thereby forming the two collector regions. When the epitaxial method is adopted, a low-concentration epitaxial layer is grown on the semiconductor substrate doped with N-type impurities at high concentration, thereby forming the two collector regions.

Figure 4:
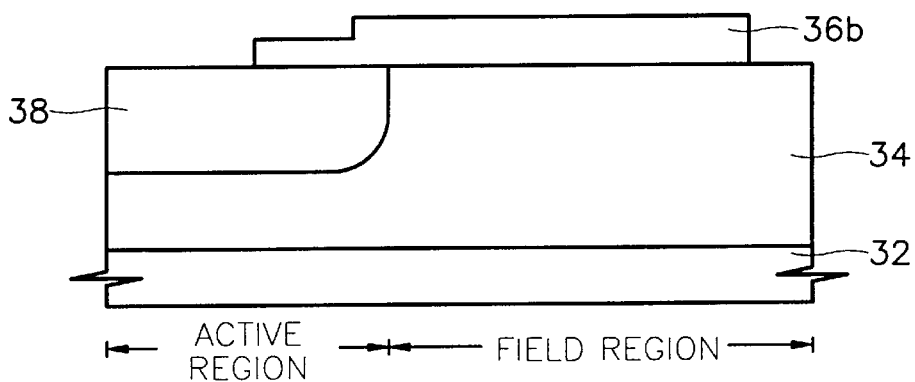

FIG. 4 shows the steps of forming a base region 38 and of forming a second mask 36b for emitter and channel stop regions.

To be more specific, P-type impurities such as boron (B) are ion-implanted at high concentration into the low-concentration (N$^-$) collector region 34 using the first mask 36a (see FIG. 3) as a mask. Then, the resultant structure is thermally treated, thereby forming the P$^+$ base region 38. At this time, the oxide film is grown on the semiconductor substrate by a thermal treatment, whereby the thicknesses of the oxide film on the field and active regions become different. Next, the oxide film is patterned by a photolithography process, thereby forming the second mask 36b which exposes the semiconductor substrate on which an emitter region and a channel stop region are to be formed.

Figure 5:
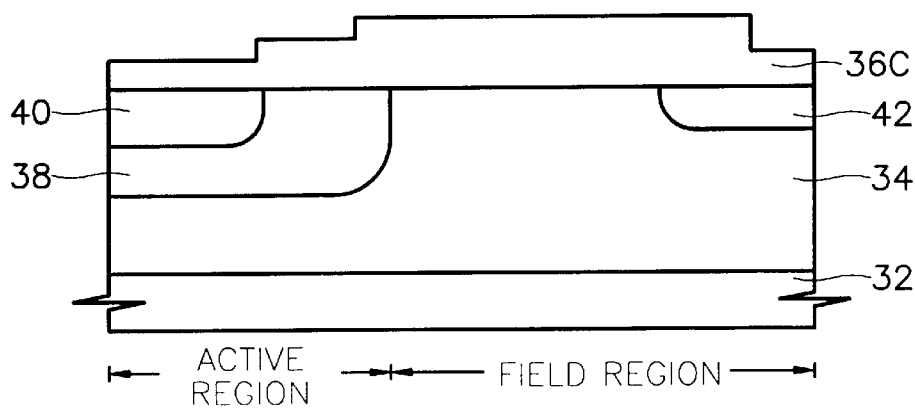

FIG. 5 shows the step of forming an emitter region 40 and a channel stop region 42. To be more specific, N-type impurities such as phosphorus (P) are ion-implanted at high concentration into the semiconductor substrate using the second mask 36b of FIG. 4 as a mask. The resultant structure is then thermally treated, thereby forming the N$^+$ emitter region 40 and the channel stop region 42. At this time, the oxide film is again grown on the semiconductor substrate during the thermal treatment. Therefore, as shown in FIG. 5, the oxide film 36c is formed having different thicknesses above the field region, the base region, and the emitter region, respectively.

Figure 6:
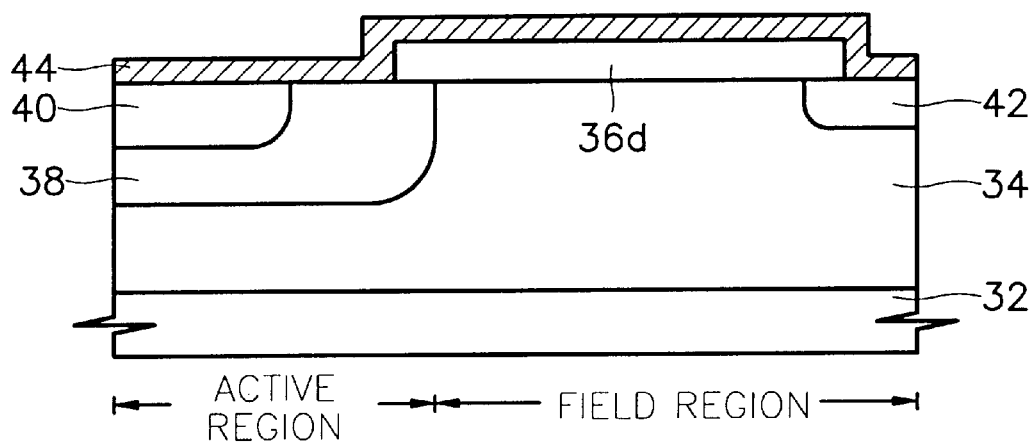

FIG. 6 shows the step of forming a SIPOS film 44. To be more specific, the oxide film 36c is etched to expose the active region of the semiconductor substrate. At this time, the etching process is performed using a typical oxide film etchant, such as a diluted hydro-fluoric (HF) solution, by a time etch method, until the oxide film on the active region, i.e., the base and emitter regions 38 and 40, is completely removed. Preferably, the etching is performed until the thickness of the oxide film 36d on the field region is between approximately 0.2 µm and 2.0 µcm.

As described above, if the oxide film is time-etched, bearing in mind the fact that the thicknesses of parts of the oxide film are different, the oxide film 36d can remain only on the field region without a special photolithography process, as shown in FIG. 6. Therefore, a great expense will not be incurred, nor will voids be generated when the oxide film is wet- or dry-etched as in the conventional art.

Next, the SIPOS film 44 is formed on the entire surface of the resultant structure, using a conventional deposition method such as chemical vapor deposition (CVD) or low pressure CVD (LP-CVD).

Figure 8:
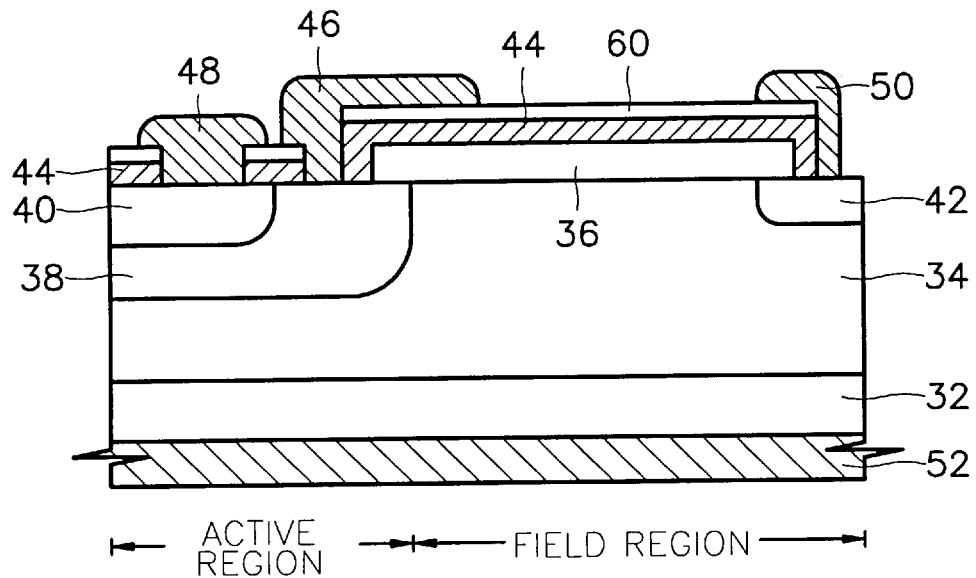
FIG. 8 is a cross-sectional view illustrating a method for fabricating a power semiconductor device according to a second preferred embodiment of the present invention.

Meanwhile, a protective film being an oxide film or a nitride film may be formed on the SIPOS film 44, so that the reliability of the device is improved. FIG. 8 shows a structure where the protective film is formed on the SIPOS film 44.

Figure 7:
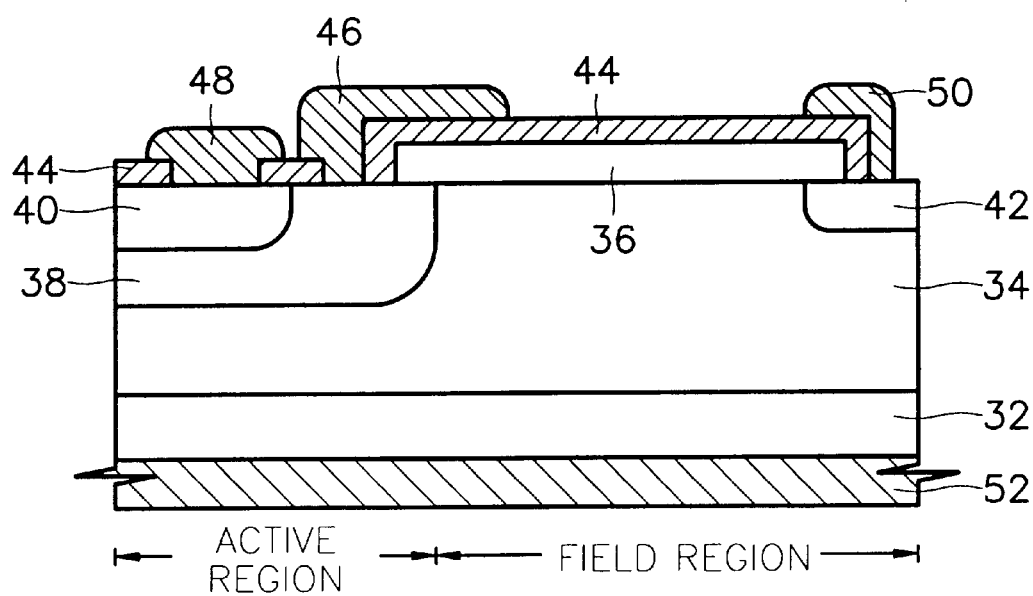

FIG. 7 shows the step of forming a base electrode 46, an emitter electrode 48, an equipotential metal ring 50, and a collector electrode 52.

To be more specific, the SIPOS film 44 is etched using a conventional photolithography process to form contact holes, exposing parts of the base region 38, the emitter region 40, and the channel stop region 42. Next, a metal film, e.g., an aluminum (Al) film, is deposited over the entire surface of the resultant structure on which the contact holes are formed, and then the resultant structure is patterned, thereby forming the base electrode 46, the emitter electrode 48, and the equipotential electrode 50 contacting the respective regions. Then, a metal film is formed on the other surface of the high-concentration (N+) collector region 32, thereby forming the collector electrode 52.

FIG. 8 shows the structure according to a second preferred embodiment where a protective film 60 is formed on the SIPOS film 44 to improve the reliability of the device.

Figure 9:
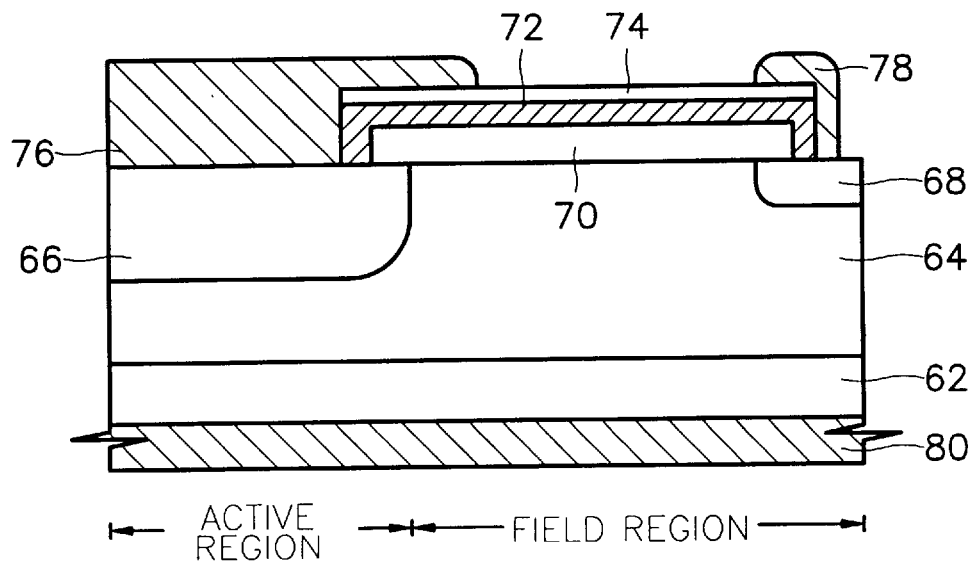
FIG. 9 is a cross-sectional view illustrating a method for fabricating a power semiconductor device according to a third preferred embodiment of the present invention.

FIG. 9 is a cross-sectional view illustrating a method of manufacturing a power semiconductor device according to a third preferred embodiment of the present invention.

In the third preferred embodiment, the insulating film remains only over the field region as in the first embodiment of the present invention. The insulating film 70 is etched by the time etch method of wet etching, using the fact that the thickness of the insulating film 70 is different on the field region, the anode region 66, and the channel stop region 68 as in the first embodiment of the present invention. Accordingly, the insulating film 70 can remain only on the field region without needing a mask.

In FIG. 9, reference numeral 72 denotes a SIPOS film formed to prevent an electric field from being concentrated at the edge of the anode region 66, and reference numeral 74 is a protective film formed on the SIPOS film 72 to further improve the reliability of the device. The protecting film can be an oxide film or a nitride film, or could be omitted altogether.

Reference numeral 62 is a high-concentration cathode region; reference numeral 64 is a low-concentration cathode region; reference numeral 76 is an anode electrode; reference numeral 78 is an equipotential electrode; and reference numeral 80 is a cathode electrode.

Optimal embodiments have been disclosed in these drawings and this specification. Here, particular terms were used simply to explain the present invention, not to restrict meanings or limit the scope of the present invention claimed in the following claims.

According to the method for manufacturing the power semiconductor device of the present invention described above, an insulating film mask for forming junction layers is formed on only a field region without a special photographic process. Therefore, an improved power semiconductor device with no voids can be achieved at low expense.

What is claimed is:

1. A method for manufacturing a power semiconductor device, comprising the steps of:
    (a) forming a conductive collector region in a semiconductor substrate;
    (b) forming a first insulating film over collector region, the first insulating film exposing a first portion of the collector region;
    (c) forming a conductive base region in the exposed first portion of the collector region;
    (d) forming a second insulating film over the collector region, the second insulating film exposing a second portion of the collector region and a third portion of the base region;
    (f) implanting first impurities for the emitter region into the third portion of the base region;
    (g) implanting second impurities for the channel stop region into the second portion of the collector region;
    (h) simultaneously forming a third insulating film over the collector region, forming a conductive emitter region by diffusing the first implanted impurities, and forming a channel stop region by diffusing the second implanted impurities;
    (i) removing portions of the first, second, and third insulating films over the base, emitter, and channel stop regions to create a remaining insulating film in a field region between the base region and the channel stop region;
    (j) forming a semi-insulating polycrystalline silicon (SIPOS) film over the semiconductor substrate and the remaining insulating layer, such that parts of the base region, the emitter region, and the channel stop region are exposed;
    (k) forming a base electrode contacting the base region;
    (l) forming an emitter electrode contacting the emitter region; and
    (m) forming an equipotential metal ring contacting the channel stop region.

2. A method for manufacturing a power semiconductor device as recited in claim 1, wherein in step (i), the first to third insulating films are etched until a surface of the base region is exposed.

3. A method for manufacturing a power semiconductor device as recited in claim 2, wherein step (i) is performed using a wet etching method.

4. A method for manufacturing a power semiconductor device as recited in claim 1, wherein in step (i), etching is performed until the thickness of the remaining insulating film is between about 0.2 $\mu$m and about 2.0 $\mu$m.

5. A method for manufacturing a power semiconductor device as recited in claim 1, wherein step (i) further comprises the substep of forming a protective film over the semi-insulating polycrystalline silicon film.

6. A method for manufacturing a power semiconductor device as recited in claim 5, wherein the protective film comprises a material selected from the group consisting of an oxide film and a nitride film.

7. A method for manufacturing a power semiconductor device as recited in claim 1, further comprising the step of forming a collector electrode on a side of the semiconductor substrate opposite the remaining insulating layer.

8. A method for manufacturing a power semiconductor device, comprising the steps of:
    (a) forming a conductive cathode region in a semiconductor substrate;
    (b) forming a first insulating film over the cathode region, the first insulating film exposing a first portion of the cathode region;
    (c) forming a conductive anode region in the exposed first portion of the cathode region;
    (d) forming a second insulating film over the cathode region, the second insulating film exposing a second portion of the cathode region;
    (e) implanting channel stop impurities into the exposed second portion of the cathode region;

(f) simultaneously forming a third insulating film over the cathode region and forming a conductive channel stop region by diffusing the channel stop impurities;

(g) removing portions of the first, second, and third insulating films over the anode and channel stop regions to create a remaining insulating film in a field region between the anode region and the channel stop region;

(h) forming a semi-insulating polycrystalline silicon (SIPOS) film over the semiconductor substrate and the remaining insulating layer such that parts of the anode region and channel stop region are exposed;

(i) forming an anode electrode contacting the anode region; and (j) forming an equipotential metal ring contacting the channel stop region.

9. A method for manufacturing a power semiconductor device as recited in claim 8, wherein in step (g), the first, second, and third insulating films are etched until the surface of the anode region is exposed.

10. A method for manufacturing a power semiconductor device as recited in claim 9, wherein step (g) is performed using a wet etching method.

11. A method for manufacturing a power semiconductor device as recited in claim 9, wherein in step (g), etching is performed until the thickness of the remaining insulating film is between about 0.2 $\mu$m and about 2.0 $\mu$m.

12. A method for manufacturing a power semiconductor device as recited in claim 8, wherein step (i) further comprises the substep of forming a protective film over the semi-insulating polycrystalline silicon film.

13. A method for manufacturing a power semiconductor device as recited in claim 12, wherein the protective film comprises a material selected from the group consisting of an oxide film and a nitride film.

14. A method for manufacturing a power semiconductor device as recited in claim, further comprising the step of forming a cathode electrode on a side of the cathode region opposite the remaining insulating layer.

* * * * *